(12) United States Patent
Lin

(10) Patent No.: US 7,824,240 B2
(45) Date of Patent: Nov. 2, 2010

(54) PLASMA DISPLAY DEVICE CAPABLE OF INCREASING ATTACHMENT OF HEAT-DISSIPATING PLATE TO PLASMA DISPLAY PANEL

(75) Inventor: Yu-Kai Lin, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 205 days.

(21) Appl. No.: 12/342,168

(22) Filed: Dec. 23, 2008

(65) Prior Publication Data
US 2009/0104833 A1 Apr. 23, 2009

Related U.S. Application Data

(62) Division of application No. 10/722,495, filed on Nov. 28, 2003, now Pat. No. 7,477,016.

(30) Foreign Application Priority Data
Oct. 7, 2003 (TW) .............................. 92127857 A

(51) Int. Cl.
H01J 17/49 (2006.01)
H01J 7/24 (2006.01)
H01J 9/24 (2006.01)

(52) U.S. Cl. .................... 445/24; 445/25; 313/582; 313/583; 313/584; 313/585; 313/586; 313/46

(58) Field of Classification Search .................. None
See application file for complete search history.

(56) References Cited

U.S. PATENT DOCUMENTS

| 5,107,176 A | 4/1992 | Endo et al. |
| 5,831,374 A * | 11/1998 | Morita et al. .................. 313/46 |
| 5,971,566 A | 10/1999 | Tani et al. |
| 6,161,910 A | 12/2000 | Reisenauer et al. |
| 6,288,489 B1 | 9/2001 | Isohata et al. |
| 6,346,334 B1 | 2/2002 | Kamitani |
| 6,410,841 B1 * | 6/2002 | Oh et al. ...................... 136/242 |

(Continued)

FOREIGN PATENT DOCUMENTS

JP 11065485 3/1999

(Continued)

OTHER PUBLICATIONS

LIN; Requirement for Restriction/Election mailed Oct. 4, 2005, filed Nov. 28, 2003, U.S. Appl. No. 10/722,495.

(Continued)

*Primary Examiner*—Mariceli Santiago
*Assistant Examiner*—Natalie K Walford
(74) *Attorney, Agent, or Firm*—Thomas, Kayden, Horstemeyer & Risley, LLP

(57) ABSTRACT

A plasma display device having a laminar attachment structure capable of increasing attachment of a heat-dissipating plate to a plasma display panel. Through a laminar attachment structure with a plurality of small pieces of thermal pad or adhesive double tape and a closed loop of thermal pad or adhesive double tape accommodating the plurality of small pieces as well as by means of vacuum pumping, the air within the closed loop is drawn out when the heat-dissipating plate is combined to the plasma display panel so as to reduce bubbles formed between the heat-dissipating plate and the plasma display panel and to increase tight attachment therebetween.

3 Claims, 5 Drawing Sheets

U.S. PATENT DOCUMENTS

| | | |
|---|---|---|
| 6,700,315 B2 * | 3/2004 | Kim et al. ............... 313/46 |
| 6,774,543 B2 | 8/2004 | Kim et al. |
| 6,856,076 B2 | 2/2005 | Kim et al. |
| 2003/0025428 A1 | 2/2003 | Kim et al. |

FOREIGN PATENT DOCUMENTS

| | | | |
|---|---|---|---|
| JP | 2003029647 A | * | 1/2003 |

OTHER PUBLICATIONS

LIN; Non-Final Office Action mailed Mar. 6, 2006, filed Nov. 28, 2003, U.S. Appl. No. 10/722,495.

LIN; Non-Final Office Action mailed Oct. 16, 2006, filed Nov. 28, 2003, U.S. Appl. No. 10/722,495.

LIN; Non-Final Office Action mailed Mar. 29, 2007, filed Nov. 28, 2003, U.S. Appl. No. 10/722,495.

LIN; Final Office Action mailed Sep. 21, 2007, filed Nov. 28, 2003, U.S. Appl. No. 10/722,495.

LIN; Advisory Action mailed Dec. 11, 2007, filed Nov. 28, 2003, U.S. Appl. No. 10/722,495.

LIN; Notice of Allowance and Fees Due mailed Sep. 8, 2008, filed Nov. 28, 2003, U.S. Appl. No. 10/722,495.

* cited by examiner

PLASMA DISPLAY DEVICE CAPABLE OF INCREASING ATTACHMENT OF HEAT-DISSIPATING PLATE TO PLASMA DISPLAY PANEL

CROSS-REFERENCE TO RELATED APPLICATION

This application is a Division of currently pending application U.S. Ser. No. 10/722,495, entitled "PLASMA DISPLAY DEVICE CAPABLE OF INCREASING ATTACHMENT OF HEAT-DISSIPATING PLATE TO PLASMA DISPLAY PANEL," and filed on Nov. 28, 2003.

FIELD OF THE INVENTION

The present invention relates to a plasma display device and, more specifically, to a plasma display device having a laminar attachment structure capable of increasing attachment of a heat-dissipating plate to a plasma display panel.

BACKGROUND OF THE INVENTION

Owing to the development in a variety of information equipments, the demand for a flat panel display (FPD) is increasingly imperative. In the trend of the modern world market toward compactness and low power consumption, the cathode ray tube (CRT) has been replaced by the flat panel display. Technologies applied in the FPD include plasma display panels (PDPs), liquid crystal displays (LCDs), electroluminescent displays, light emitting diodes, vacuum fluorescent displays (VFDs), field emission displays (FEDs) and electrochromic displays.

The plasma display device relates to a flat panel display technology in which gas in a discharge cell discharges (i.e. a plasma discharge effect) so as to emit light. The structure of the plasma display device, as shown in FIG. 1, includes a plasma display panel (PDP) 10, a thermal pad or an adhesive double tape 2, a metal plate 3 and several driving circuits (not shown). The plasma display panel 10 is formed by combination of a front plate 11 and a back plate 12. The metal plate 3 is stuck onto the rear side of the back plate 12 by the thermal pad or the adhesive double tape 2 such that the high-temperature heat produced by the plasma display panel 10 can be conducted through the thermal pad or the adhesive double tape 2 to the metal plate 3 to be dissipated. The driving circuits are installed at the rear side of the metal plate 3 to constitute a plasma display module.

Since the plasma display device is often applied in large-dimension screen panels and the panel may be slightly deformed after processing, only 40-50% of the whole area of the thermal pad or the adhesive double tape 2 is substantially attached between the plasma display panel 10 and the metal plate 3. The rest 60-50% of the whole area is full of bubbles. The attachment between the plasma display panel 10 and the metal plate 3 is reduced and heat conduction becomes poor due to lessened contact area. Hence, materials are wasted and costs are raised.

SUMMARY OF THE INVENTION

An object of the present invention is to provide a plasma display device having a laminar attachment structure capable of increasing attachment of a heat-dissipating plate to a plasma display panel.

Another object of the present invention is to provide a method for attaching a heat-dissipating plate onto a plasma display panel. A complete sheet of thermal pad or adhesive double tape is divided into several small pieces and a closed loop forming a closed region to accommodate those small pieces of thermal pad or adhesive double tape. The air within the closed region is drawn out by vacuum pumping so as to reduce bubbles formed on the attached surfaces between the heat-dissipating plate and the plasma display panel.

A plasma display device disclosed in this invention comprises a plasma display panel and a heat-dissipating plate mounted on the plasma display panel. The heat-dissipating plate is thermally connected to the plasma display panel through a laminar attachment structure. The laminar attachment structure includes an annular channel which divides the laminar attachment structure into an outer closed portion and an inner portion and communicates with the external environment through at least one vacuum-pumping aperture formed at the heat-dissipating plate.

In another embodiment of this invention, the laminar attachment structure is constructed as a plurality of strips spaced apart from each other, and a respective guide trench is formed at the spaces between the plurality of strips to guide out the air within the plurality of strips. Moreover, the two ends of the guide trench may be sealed to form a closed region for vacuum pumping.

Furthermore, a method for attaching a heat-dissipating plate onto a plasma display panel is disclosed in this invention. Firstly, one face of a laminar attachment structure is attached onto the plasma display panel, wherein the laminar attachment structure comprises an outer closed portion and a plurality of sheet portions spaced apart from each other within the closed portion. Then, apertures are formed at the heat-dissipating plate corresponding to the spaces of the plurality of sheet portions for vacuum pumping. Subsequently, when the heat-dissipating plate is attached onto the other face of the laminar attachment structure, instantaneous pumping is simultaneously performed to draw out the air within the closed portion through the apertures such that the heat-dissipating plate is tightly attached onto the plasma display panel.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

Figure 1:
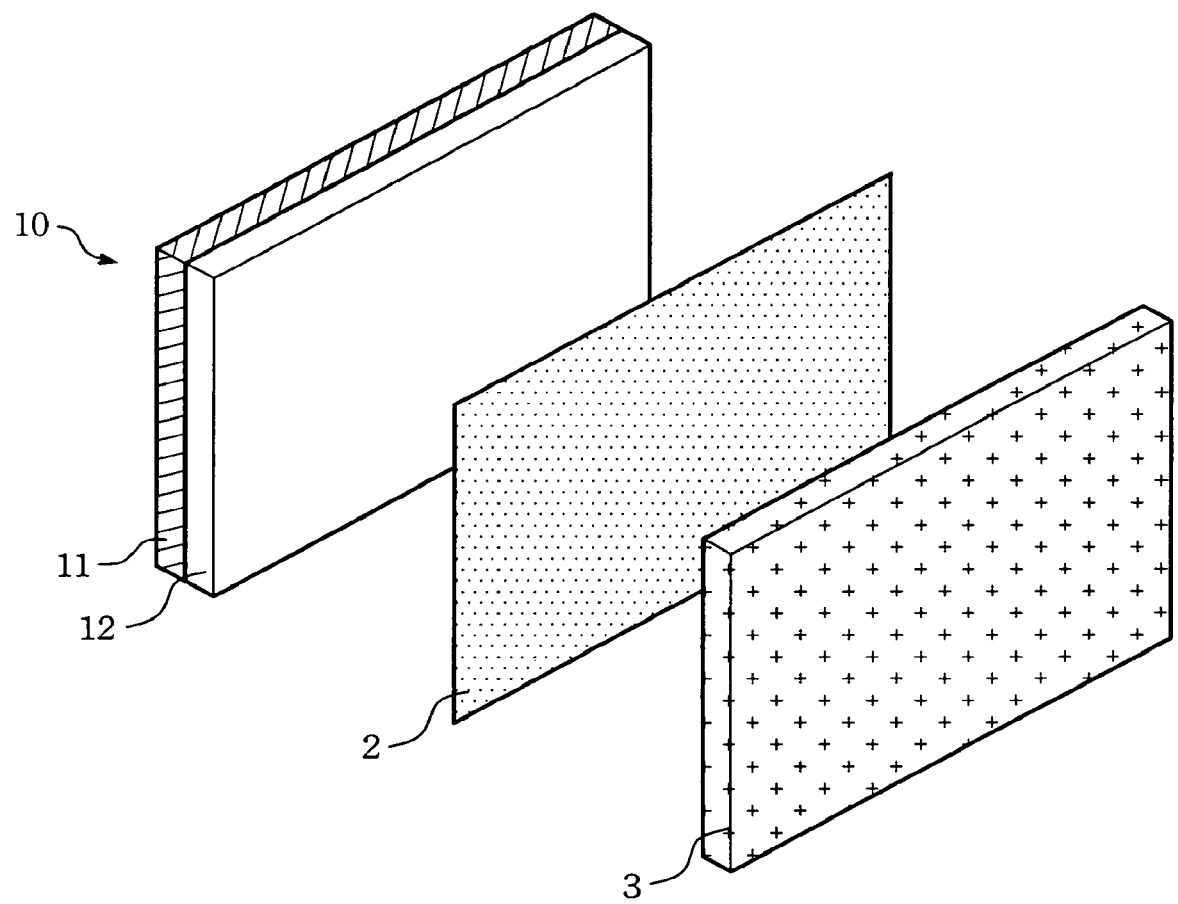
FIG. 1 is a schematic exploded diagram of a heat-dissipating structure of a conventional plasma display device.
Figure 2:
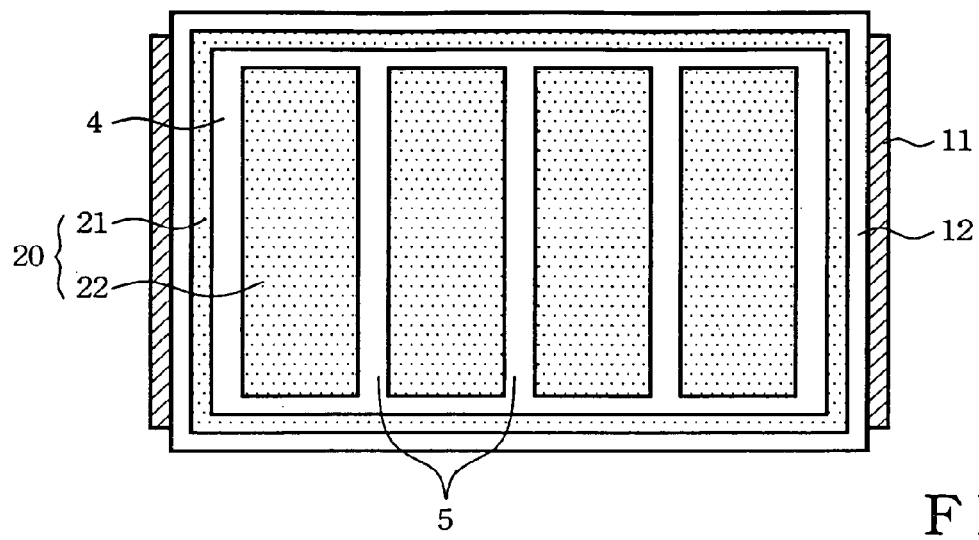
FIGS. 2 and 3 are respectively a top view and a sectional view of a laminar attachment structure having a continuous closed loop and sandwiched between a plasma display panel and a heat-dissipating metal plate in accordance with a first embodiment of this invention.
Figure 3:
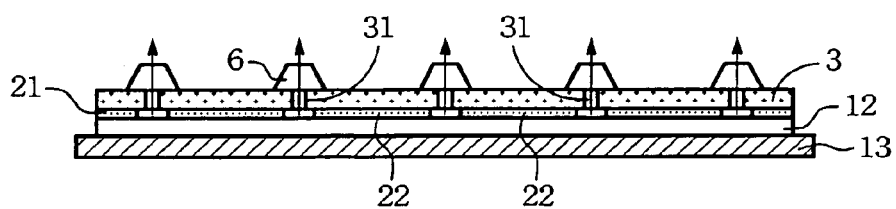

FIGS. 2 and 3 are respectively a top view and a sectional view of a laminar attachment structure 20 sandwiched between the plasma display panel 10 and the heat-dissipating metal plate 3 in accordance with a first embodiment of this invention. The plasma display panel 10 has a front plate 11 and a back plate 12, and the heat-dissipating metal plate 3 is used to dissipate the heat produced by the plasma display panel 10. The laminar attachment structure 20 may be a thermal pad or adhesive double tape.

As shown in FIG. 2, a complete sheet of thermal pad or adhesive double tape is cut into several small pieces 22 and an annular closed loop 21 forming a closed region to accommodate those small pieces of thermal pad or adhesive double tape 22. The small pieces 22 and the closed loop 21 are firstly attached to the backside of the back plate 12 of the plasma display panel, wherein the closed loop 21 is stuck on the outer periphery of the backside of the back plate 12 to enclose the small pieces of thermal pad or adhesive double tape 22 in a spaced attachment on the backside of the back plate 12, thereby forming the laminar attachment structure 20. The laminar attachment structure 20 are then divided into an outer closed portion of the closed loop 21 and an inner portion of the small pieces 22. An annular channel 4 is formed between the closed loop 21 and the pieces of thermal pad or adhesive double tape 22, and a respective trench 5 is formed between the small pieces of thermal pad or adhesive double tape 22 spaced apart from each other. Since the whole sheet of thermal pad or adhesive double tape has been cut into several small pieces, bubbles produced between the back plate of the plasma display panel and the pieces of thermal pad or adhesive double tape during attachment are certainly diminished.

Subsequently, when the heat-dissipating metal plate 3 is stuck to the laminar attachment structure 20 on the backside of the back plate 12 of the plasma display panel, the air within the closed loop 21 is drawn out by vacuum pumping so as to reduce bubbles produced between the heat-dissipating metal plate 3 and the pieces of thermal pad or adhesive double tape 22. One method is to form a plurality of vacuum-pumping apertures 31 at the heat-dissipating metal plate 3 corresponding to the spaced trenches 5 of the pieces of thermal pad or adhesive double tape 22 and the annular channel 4. Preferably, those apertures 31 are mounted above the annular channel 4 and the trenches 5. Vacuum suckers 6 are installed on the apertures 31 of the heat-dissipating metal plate 3. When the heat-dissipating metal plate 3 is attached downward to the laminar attachment structure 20, the vacuum suckers 6 are simultaneously used to instantaneously pump out the air within the closed loop 21 through the apertures 31 so that the heat-dissipating metal plate 3 is tightly attached on the back plate 12 of the plasma display panel. The substantial attached area of the back plate 12 of the plasma display panel to the heat-dissipating metal plate 3 in this invention can be increased to more than 85% of the whole area.

Figure 2A:
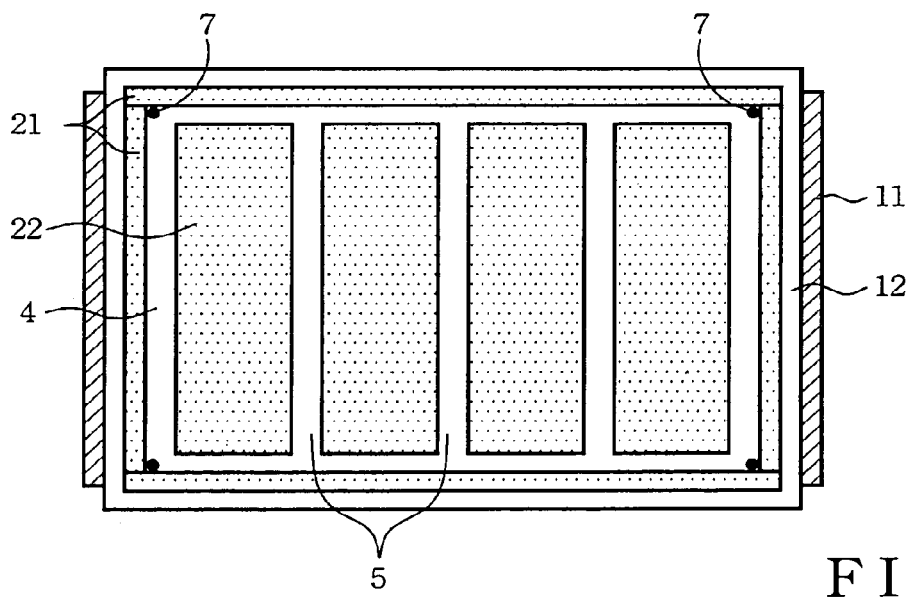
FIG. 2A is a top view of a laminar attachment structure having a discontinuous closed loop in accordance with the first embodiment of this invention.

The closed loop 21 as shown in FIG. 2 is a continuous loop as a whole. FIG. 2A shows a discontinuous annular closed loop 21'. The discontinuous closed loop 21' is formed by attachment of four slender thermal pads or adhesive double tapes, and glue dots 7 are coated around the joints of the four slender thermal pads or adhesive double tapes to have the discontinuous closed loop 21' form a closed region.

Figure 4:
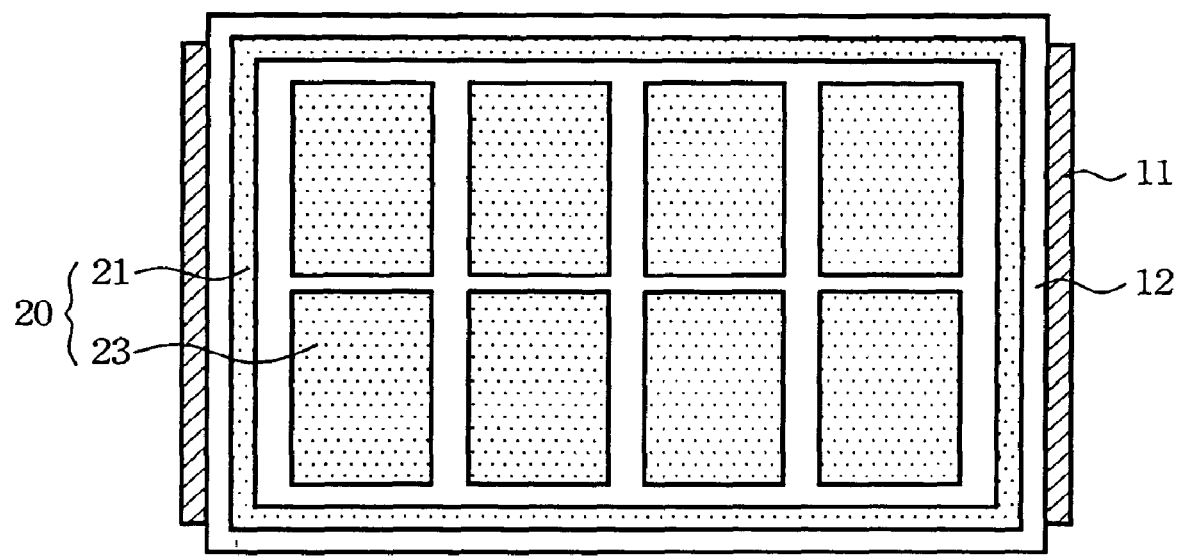
FIGS. 4 and 5 are respectively a top view of a laminar attachment structure having a continuous closed loop in accordance with a second embodiment of this invention.
Figure 5:
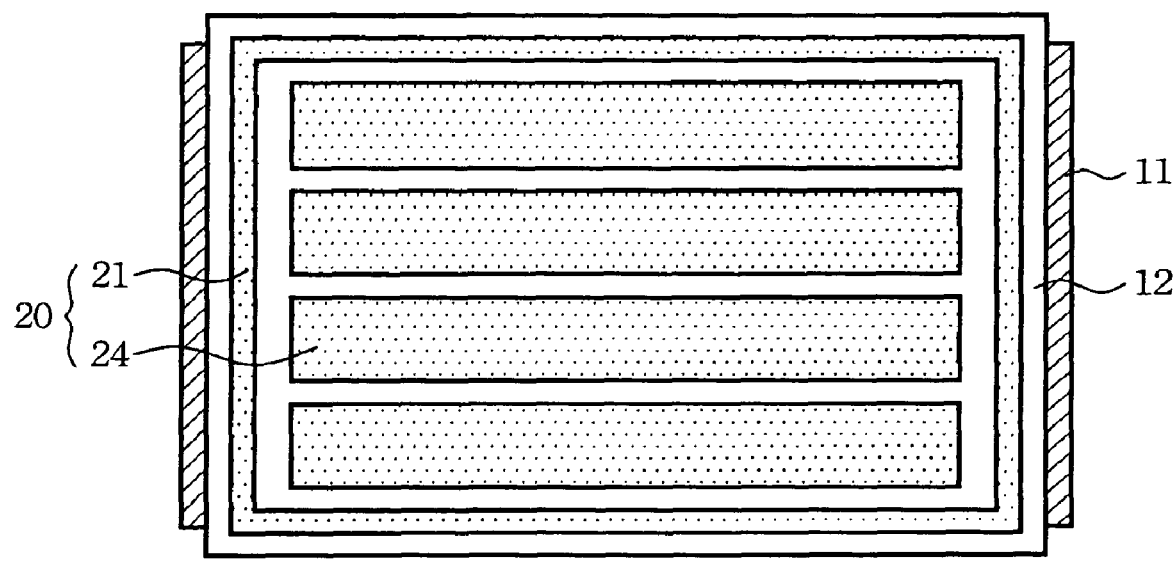

FIGS. 4 and 5 are respectively top views of the laminar attachment structure 20 in accordance with a second embodiment of this invention, wherein several small pieces of thermal pad or adhesive double tape 23, 24 accommodated within the closed loop 21 may have different arrangement and shape from FIG. 2.

Figure 6:
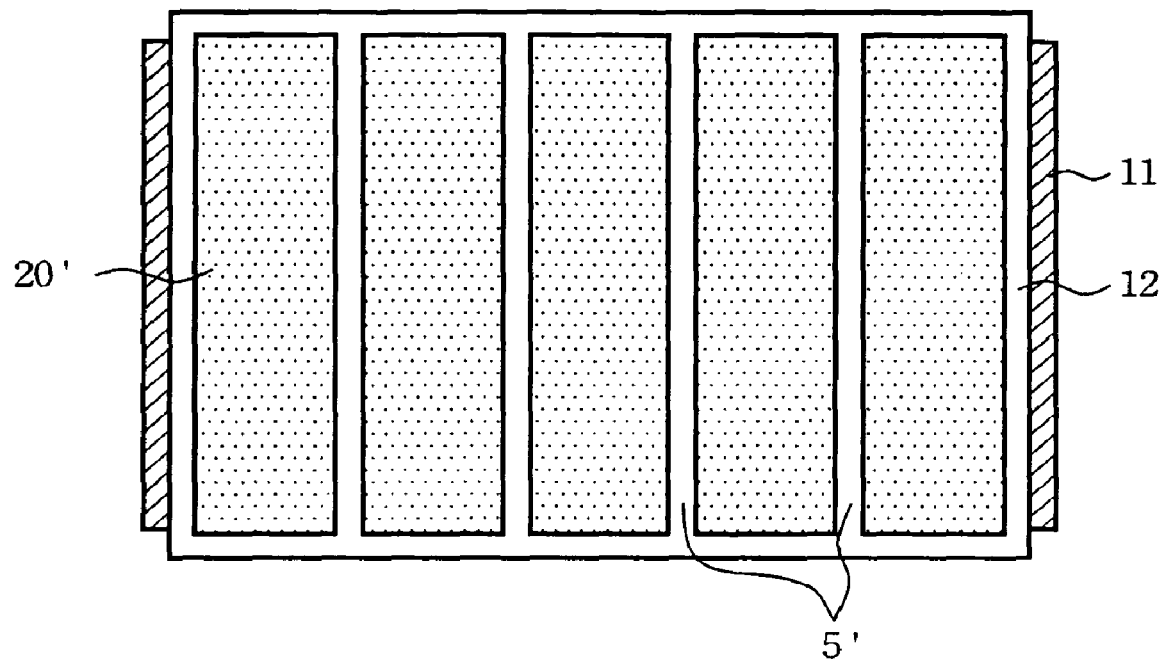
FIGS. 6 and 7 are respectively a top view of a laminar attachment structure without a closed loop in accordance with a third embodiment of this invention.
Figure 7:
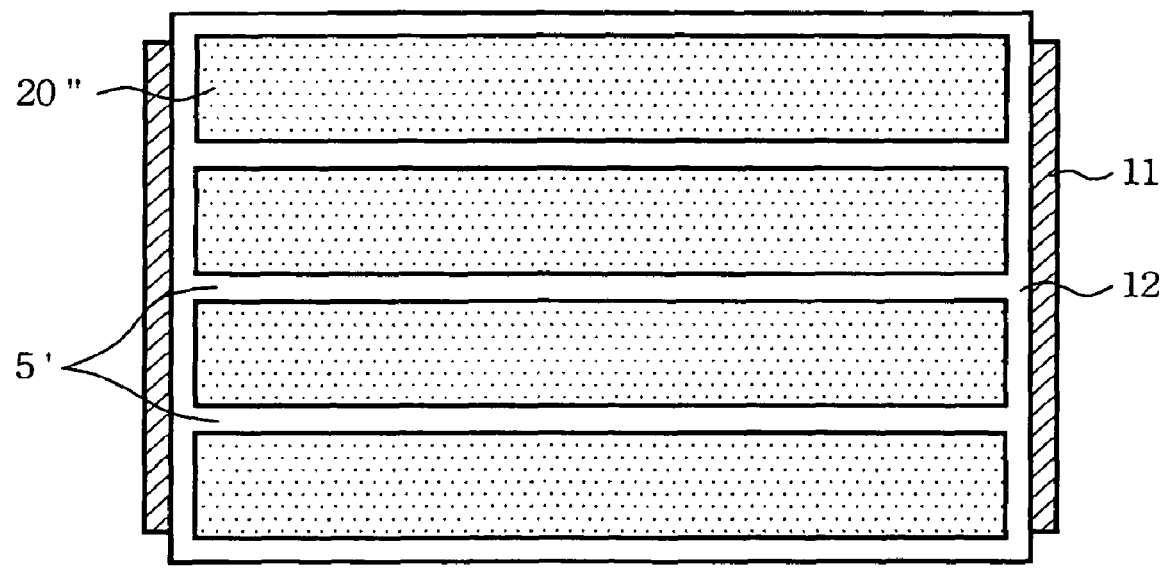

FIGS. 6 and 7 are respectively top views of laminar attachment structures 20' and 20" without a closed loop in accordance with a third embodiment of this invention. In this embodiment, a complete sheet of thermal pad or adhesive double tape is cut into several small pieces, and the small pieces of thermal pad or adhesive double tape are sandwiched between the heat-dissipating metal plate 3 and the back plate 12 of the plasma display panel in spaced attachment. Since the attached area of the piece of thermal pad or adhesive double tape is small and guide trenches 5' between the pieces of thermal pad or adhesive double tape can guide the air out of the guide trenches 5'. Therefore, the attached area in this embodiment is still larger than that of the back plate of the plasma display panel to the heat-dissipating metal plate with the whole sheet of thermal pad or adhesive double tape.

Figure 8:
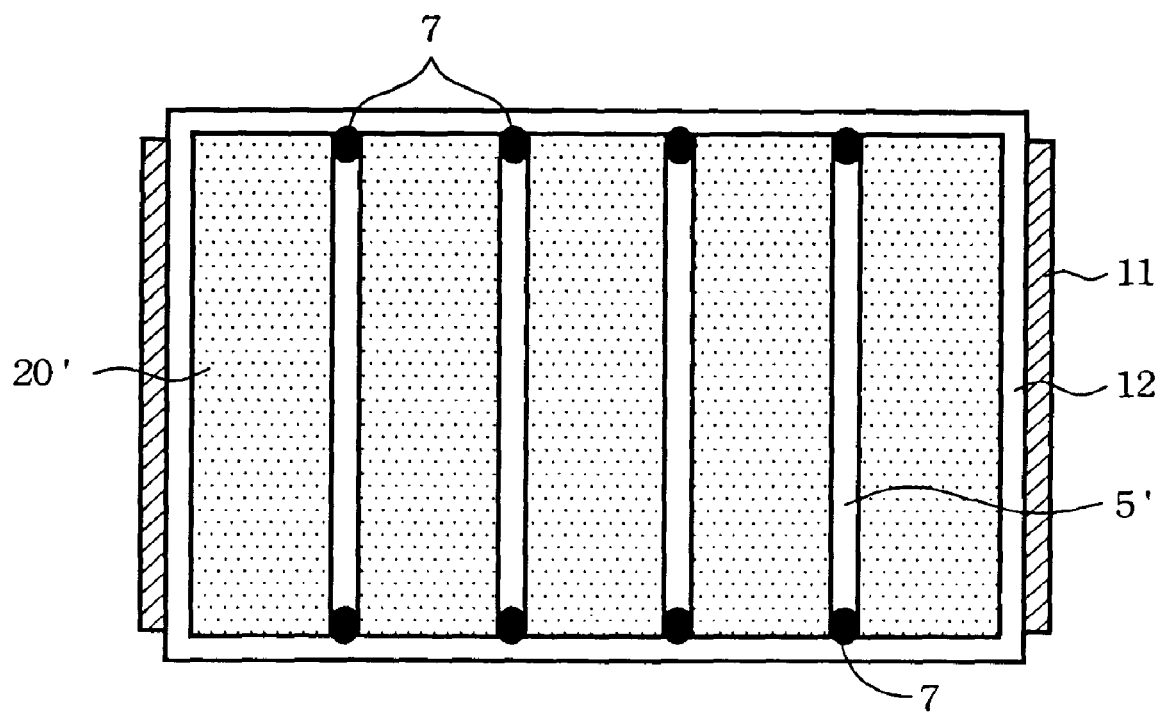
FIGS. 8 and 9 are respectively a top view of a laminar attachment structure with a closed loop in accordance with a third embodiment of this invention.
Figure 9:
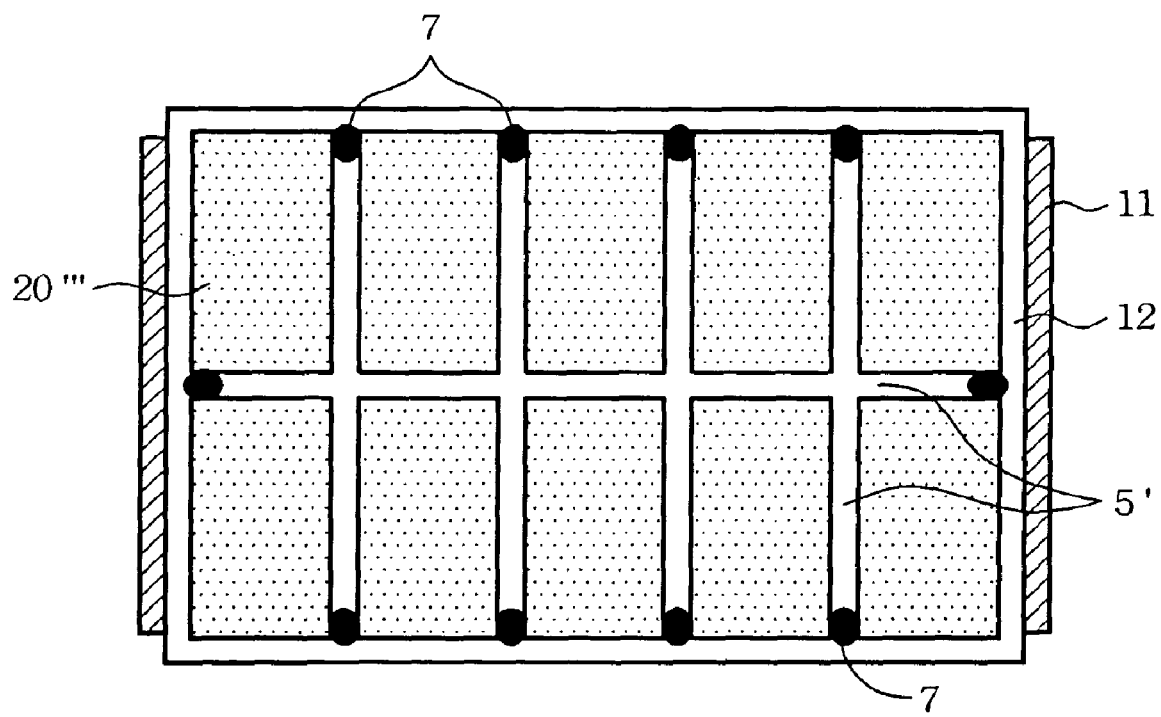

FIGS. 8 and 9 are respectively top views of laminar attachment structures 20' and 20''' with a closed loop in accordance with a third embodiment of this invention. In this embodiment, glue dots 7 are coated at the ends of the guide trenches 5' between the small pieces of thermal pad or adhesive double tape to have each of the guide trenches 5' form a closed loop or a closed region. When the heat-dissipating metal plate is attached downward to the laminar attachment structures 20' and 20''', vacuum suckers are simultaneously used to immediately draw out the air within the closed loops through vacuum-pumping apertures formed at the heat-dissipating metal plate corresponding to the guide trenches 5' so that the heat-dissipating metal plate is tightly attached on the back plate 12 of the plasma display panel.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for attaching a heat-dissipating plate onto a plasma display panel, comprising:
    attaching one face of a laminar attachment structure onto the plasma display panel; wherein the laminar attachment structure comprises an outer closed portion and a plurality of sheet portions spaced apart from each other within the outer closed portion to form an annular channel and at least
a trench;
    forming apertures at the heat-dissipating plate corresponding to the spaces of the plurality of sheet portions for vacuum pumping; and
    instantaneously drawing out the air within the closed portion through the apertures simultaneously when the heat-dissipating plate is attached onto the other face of the laminar attachment structure, thereby tightly attaching the heat-dissipating plate onto the plasma display panel.

2. The method of claim 1, wherein the laminar attachment structure is made of a thermal pad.

3. The method of claim 1, wherein the laminar attachment structure is made of an adhesive double tape.

* * * * *